United States Patent
Segawa et al.

(10) Patent No.: US 6,211,746 B1
(45) Date of Patent: Apr. 3, 2001

(54) INTEGRATION METHOD AND INTEGRATION CIRCUIT OFFERING IMPROVED SIGNAL-TO-NOISE RATIO, AND VOLTAGE-CONTROLLED OSCILLATOR AND FREQUENCY-VOLTAGE CONVERTER EMPLOYING INTEGRATION CIRCUIT

(75) Inventors: Yuji Segawa; Kunihiko Gotoh, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/362,661

(22) Filed: Jul. 29, 1999

(30) Foreign Application Priority Data

Jul. 31, 1998 (JP) .................................. 10-216592

(51) Int. Cl.$^7$ ...................................... H03K 3/02
(52) U.S. Cl. ........................... 331/143; 331/111; 327/131
(58) Field of Search ................... 331/17, 14, 143, 331/34, 111, 177 R, 175; 327/131, 172, 173, 176, 336, 344

(56) References Cited

U.S. PATENT DOCUMENTS

| | | | |
|---|---|---|---|
| 4,736,118 | * 4/1988 | Fischer | 307/265 |
| 4,871,985 | * 10/1989 | Sempel | 331/111 |
| 5,128,634 | * 7/1992 | Pigott | 331/143 |
| 6,057,739 | * 5/2000 | Crowley et al. | 331/14 |
| 6,060,957 | * 5/2000 | Kodrnja et al. | 331/143 |

* cited by examiner

Primary Examiner—Robert Pascal
Assistant Examiner—Henry Choe
(74) Attorney, Agent, or Firm—Armstrong, Westerman, Hattori, McLeland & Naughton

(57) ABSTRACT

Disclosed are an integration circuit capable of substantially raising the ratio of a current to a capacitance, I/C, and voltage-controlled oscillator and frequency-voltage converter which employ the integration circuit. The integration circuit comprises an integrating capacitor, a current source, a switch, a detection circuit, and a control circuit. The current source supplies a current to the integrating capacitor. The switch is installed on a path along which a current is supplied from the current source to the integrating capacitor. The detection circuit detects a voltage developed at the integrating capacitor. The control circuit controls the switch so that a current will be supplied from the current source to the integrating capacitor during an integration period. The integration period falls into a current supply period and a stop period. The control circuit controls the switch so that a current will be supplied from the current source to the integrating capacitor during the current supply period and no current will be supplied from the current source to the integrating capacitor during the stop period.

18 Claims, 16 Drawing Sheets

$$(T - 2T0) \propto \frac{RC}{Vin}(V_{RH} - V_{RL})$$

INTEGRATION METHOD AND INTEGRATION CIRCUIT OFFERING IMPROVED SIGNAL-TO-NOISE RATIO, AND VOLTAGE-CONTROLLED OSCILLATOR AND FREQUENCY-VOLTAGE CONVERTER EMPLOYING INTEGRATION CIRCUIT

BACKGROUND OF THE INVENTION

1. Field of the Invention

The present invention relates to an integration method and integration circuit widely adopted for electronic circuits, and a voltage-controlled oscillator adopted widely for electronic circuits and to a frequency-voltage converter employing the integration circuit. More particularly, this invention is concerned with an integration method and integration circuit suitable for applications in which a variation in a factor relevant to charging or discharging an integrating capacitor falls within a predetermined narrow range. This invention is also concerned with a voltage-controlled oscillator and frequency-voltage converter employing the integration circuit.

2. Description of the Related Art

An integration circuit is widely adopted as part of an electronic circuit. When supply of a direct current to an integrating capacitor is started, a terminal voltage or a voltage developed at a terminal of the integration circuit rises with the passage of time. Assuming that a current is I, the terminal voltage is Vc, the capacitance of the integrating capacitor is C, and an integration time is T, the relationship of $Vc=(I/C) \times T$ is established. Herein, C is a fixed value.

When the integration circuit is used as part of an electronic circuit, the above relationship is utilized. One of I, T, and Vc is set to a predetermined value, and another one thereof is varied. A variation in the remaining one is detected. For example, the integration circuit may be used as part of a voltage-controlled oscillator. In this case, two reference voltages are determined, and the current I is varied proportionally to a voltage for inducing charge. When Vc reaches a first (higher) reference voltage, an output signal is varied. At the same time, the current I is varied for inducing discharge. When Vc reaches the second (lower) reference voltage, the output signal is varied. The current I is varied for inducing charge again. Thus, the output signal oscillates at a frequency dependent on a voltage.

In this kind of voltage-controlled oscillator, for example, a noise may be superposed on a reference voltage. In this case, a discharge period during which an integrating capacitor is discharged becomes unstable. This causes jitter in the output signal, and poses a problem in that a high-precision oscillating signal cannot be produced. As long as the magnitude of the noise is unchanged, the jitter relates to the ratio of the current I to the capacitance C, I/C. To reduce the jitter, the ratio I/C must be raised, and a change rate at which the terminal voltage of the integral capacitance makes a transition must be raised. However, the integration time is determined with the cycle of the oscillating signal. A difference between the two reference voltages cannot be increased. Consequently, it is impossible to raise the ratio I/C.

Moreover, a frequency-voltage converter employs the integration circuit as part of an electronic circuit. An input signal is, for example, a zero-crossing signal. When the input signal crosses a zero level, a pulsating signal is generated. The pulsating signal is used to reset the integration circuit. A terminal voltage or a voltage developed at a terminal of the integration circuit is sampled and held. An output signal is then produced based on the terminal voltage.

In the frequency-voltage converter, if a change rate at which the frequency of an input signal changes is low, a change rate at which the voltage level of an output signal changes is also low. This poses a problem in that the output signal is susceptible to a noise and the frequency-voltage converter suffers from a poor signal-to-noise ratio in terms of the output signal. To solve this problem, the ratio I/C of the current I to the capacitance C should be increased, and the change rate at which the terminal voltage Vc of the integrating capacitor makes a transition should be raised. When I/C is raised, Vc exceeds a voltage level that can be sampled and held. This is a problem and I/C cannot therefore be raised.

As mentioned above, as far as a circuit employing the integration circuit is concerned, it is preferred to raise the ratio I/C of a current to a capacitance for minimizing the influence of a noise. In practice, however, there is difficulty in raising I/C.

SUMMARY OF THE INVENTION

An object of the present invention is to realize an integration method and integration circuit capable of substantially raising the ratio I/C of a current to a capacitance. Moreover, an object of the present invention is to realize a voltage-controlled oscillator employing the integration circuit for reducing jitter, and a frequency-voltage converter offering a high signal-to-noise ratio.

In the integration method and integration circuit of the present invention, integration is suspended. The present inventor has directed his/her attention to the fact that factors relevant to charge or discharge of the integration circuit, that is, a charging or discharging current, a reference voltage or detection voltage, and a time vary within a limited range. A period during which integration is suspended falls within a range of variations in the time required by one integration. If the end of integration can be detected, although integration is suspended, necessary actions can be carried out. Moreover, an integration time is substantially shortened. Consequently, the ratio I/C of a current to a capacitance can be raised substantially.

In other words, an integration method in accordance with the present invention comprises a charge step at which an integrating capacitor is charged and a voltage detection step at which a voltage developed at the integrating capacitor is detected. The charge step includes a current supply step at which a current is supplied to the integrating capacitor and a stop step at which charge of the integrating capacitor is stopped during a predetermined period.

An integration circuit in accordance with the present invention comprises an integrating capacitor, a current source, a switch, a detection circuit, and a control circuit. The current source supplies a current to the integrating capacitor. The switch is installed on a path along which a current is supplied from the current source to the integrating capacitor. The detection circuit detects a voltage developed at the integrating capacitor. The control circuit controls the switch so that a current will be supplied from the current source to the integrating capacitor during an integration period. The integration period falls into a current supply period and a stop period. The control circuit controls the switch so that a current will be supplied from the current source to the integrating capacitor during the current supply period, and no current will be supplied from the current source to the integrating capacitor during the stop period.

The stop period during which current supply is stopped may be set in the middle of the integration period or at the start thereof. However, it is required that the end of integration can be detected. Moreover, the stop period during which current supply is stopped must be exactly constant but may be variable.

A voltage-controlled oscillator in accordance with the present invention comprises an integrating capacitor, a charge/discharge circuit, a reference level source, a comparison circuit, and a control circuit. The charge/discharge circuit charges or discharges the integrating capacitor using a current proportional to the voltage level of an input signal. The reference level source selectively outputs a first reference level and second reference level. The comparison circuit compares a voltage developed at the integrating capacitor with a reference level output from the reference level source, and outputs the results of comparison in the form of an oscillating signal. The control circuit controls charge and discharge of the integrating capacitor by the charge/discharge circuit. The reference level source outputs alternately the first and second reference levels in response to the oscillating signal. The control circuit alternately switches charge and discharge of the integrating capacitor in response to the oscillating signal. The control circuit controls the charge/discharge circuit so that the charge/discharge circuit will stop charge during a predetermined period within a charge period, and the charge/discharge circuit will stop discharge during the same predetermined period within a discharge period.

As far as an actual voltage-controlled oscillator is concerned, it is rare that the voltage of an input signal varies within a wide range. Normally, the input signal varies within a limited range. The voltage-controlled oscillator of the present invention treats the input signal whose voltage variation is limited, and generates an oscillating signal exhibiting little jitter. Since the voltage variation in the input signal is limited, a variation in the frequency at which the output signal oscillates is small. Consequently, a variation in the integration period is small. Even when integration is stopped during a predetermined period shorter than the lower limit of the integration period, the voltage-control oscillator can act similarly to a conventional voltage-controlled oscillator. Herein, a current generated proportionally to the voltage of the input signal and two reference levels must be determined properly, though. Moreover, since the integration period is substantially short, even if the same integrating capacitor and reference levels as those adopted conventionally are employed, the ratio I/C of the current to a capacitance can be raised. Moreover, the influence of a noise can be minimized. Consequently, jitter can be minimized.

A frequency-voltage converter in accordance with the present invention comprises an integrating capacitor, a reset circuit, a constant current source, a charge control circuit, and a sample and hold circuit. The reset circuit resets a voltage developed at the integrating capacitor at intervals of one cycle of an oscillating signal. The constant current source charges the integrating capacitor with a constant current. The charge control circuit extends control so that charge will be stopped during a predetermined period within a charge period within which the integrating capacitor is charged. The sample and hold circuit samples and holds the voltage developed at the integrating capacitor at the end of the charge period within which the integrating capacitor is charged.

In an actual frequency-voltage converter, it is rare that the frequency of an input signal varies within a wide range. Normally, the frequency variation in the input signal is limited. The frequency-voltage converter in accordance with the present invention processes the input signal, of which frequency variation is limited, and generates an accurate voltage with the influence of noise minimized. Since the frequency variation in the input signal is limited, a variation in an integration period is small. Even if integration is stopped during a predetermined period shorter than the lower limit of the integration period, the frequency-voltage converter can act similarly to a conventional frequency-voltage converter. Herein, the current to be supplied from the constant current source must be set properly. Moreover, since the integration period is substantially short, although the same integrating capacitor as the one employed conventionally is included, the ratio I/C of a current to a capacitance can be raised. Moreover, the influence of a noise can be minimized. Eventually, a high-precision output voltage can be produced at a high signal-to-noise ratio.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Before proceeding to a detailed description of the preferred embodiments, a conventional integration method and circuit, a conventional voltage controlled oscillator, and a conventional frequency-voltage converter will be described with reference to the accompanying drawings relating thereto for a clearer understanding of the differences between the conventional art and the present invention.

Figure 1:
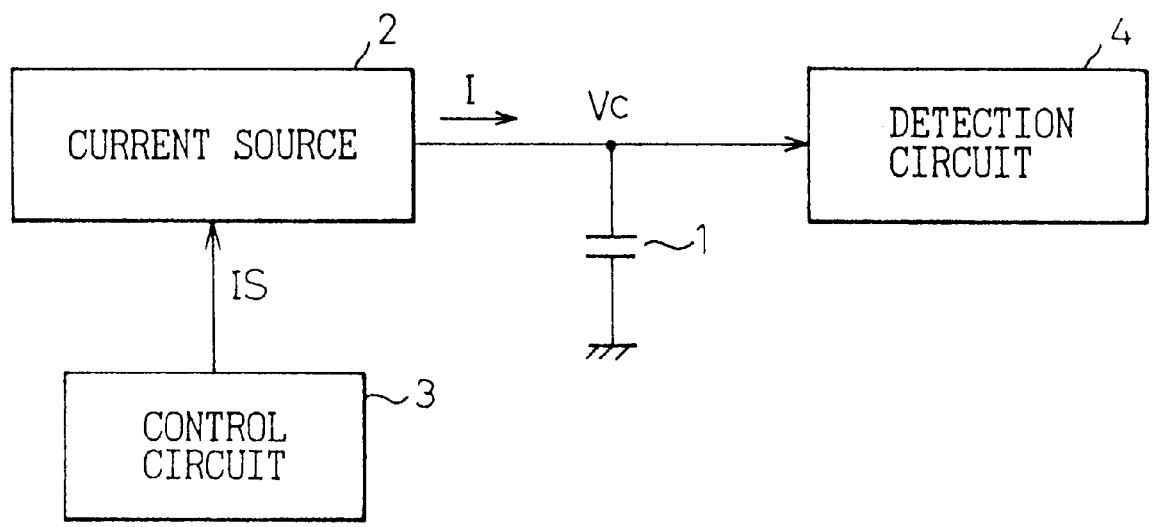
FIG. 1 is a circuit diagram showing an example of conventional integration circuits.

An integration circuit is widely adopted as part of an electronic circuit. FIG. 1 is a circuit diagram showing an example of conventional integration circuits. Referring to FIG. 1, an integrating capacitor 1 offers a capacitance C, and a current source 2 supplies a direct current to the integrating capacitor 1. A control circuit 3 supplies an integration signal IS to the current source 2 to control the current source. A detection circuit 4 detects a terminal voltage Vc or a voltage developed at a terminal of the integrating capacitor 1. When the integration signal IS is output from the control circuit 3, the current source 2 supplies a direct current to the integrating capacitor 1. The terminal voltage Vc of the integrating capacitor 1 rises with the passage of time according to the current I supplied from the current source 2. The terminal voltage Vc, the capacitance C of the integrating capacitor, and an integration time T have the relationship of Vc=(I/C)×T. The detection circuit 4 is equivalent to, for example, a comparator for comparing the terminal voltage Vc with a reference voltage or a sample and hold circuit for sampling and holding the terminal voltage Vc.

Figure 2A:
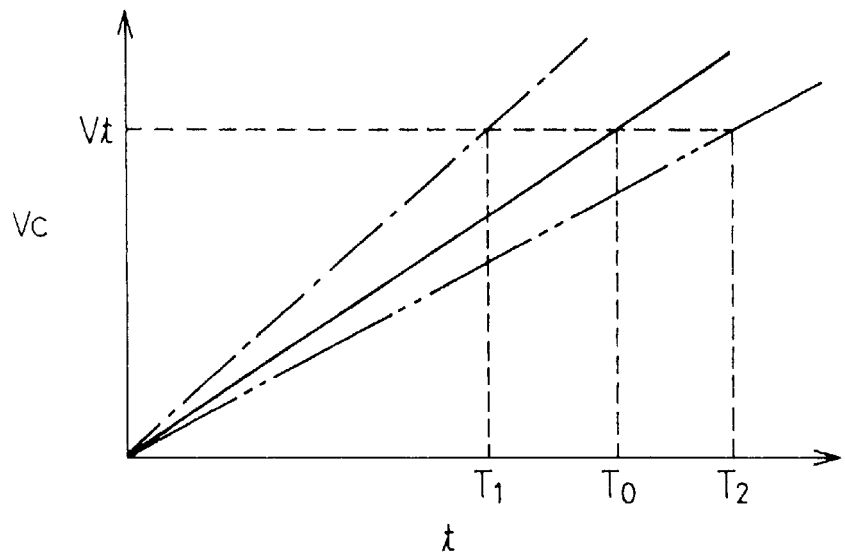
FIG. 2A and FIG. 2B show the relationship among the action of the conventional integration circuit shown in FIG. 1 and factors.
Figure 2B:
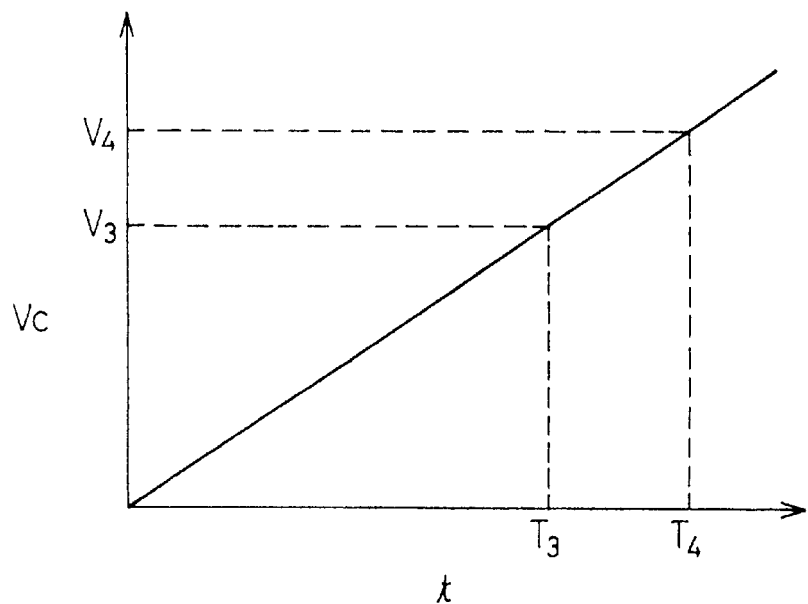

In the integration circuit, C is constant. Any of I, T, and Vc is set to a predetermined value according to the above relationship, and another one thereof is varied. A change in the remaining one is detected. For example, FIG. 2A shows the varied current I supplied from the current source in relation to the time t required until the terminal voltage Vc reaches the predetermined voltage Vt. The time t required until Vc reaches Vt varies depending on the current I. Moreover, FIG. 2B shows the varied time t in relation to the terminal voltage Vc with the current I set to a predetermined value. Examples of circuits employing the integration circuit will be described below.

Figure 3:
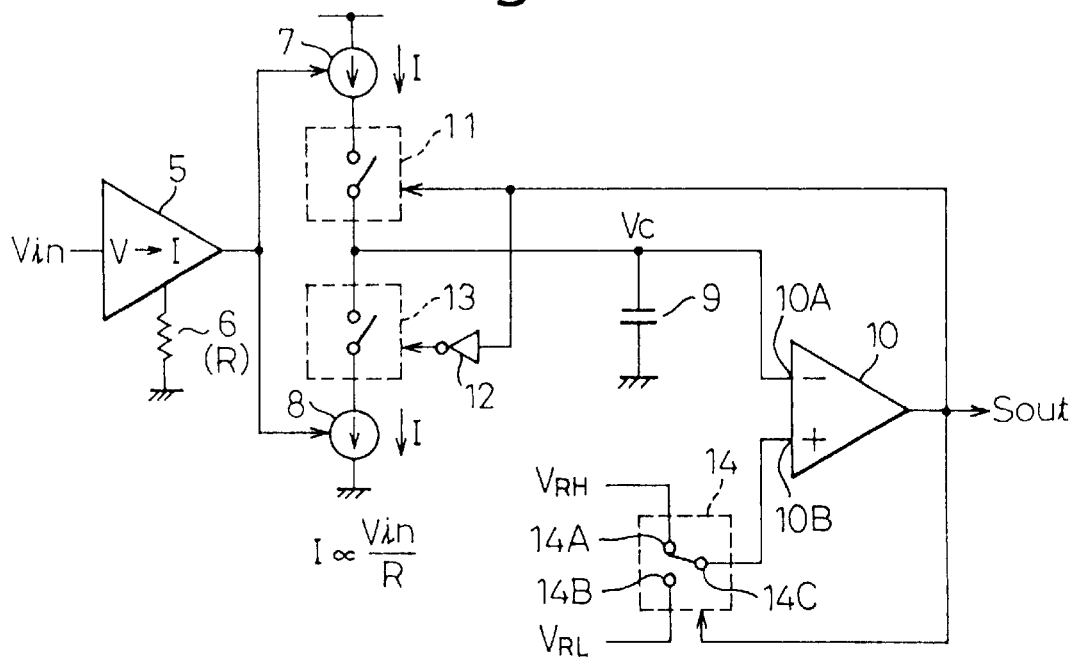
FIG. 3 is a circuit diagram showing an example of conventional voltage-controlled oscillators employing an integration circuit.

FIG. 3 is a circuit diagram showing an example of conventional voltage-controlled oscillators employing an integration circuit. Referring to FIG. 3, a voltage-current converter 5 receives an input voltage Vin (control voltage). A resistor 6 determines an output current of the voltage-current converter 5. Currents to be supplied from current-controlled current sources 7 and 8 are controlled according to the output current of the voltage-current converter 5. Assuming that a resistance offered by the resistor 6 is R, the relationship of I=Vin/R is established. There are shown an integrating capacitor 9 and a comparator 10. The comparator 10 inputs the terminal voltage Vc of the integrating capacitor 9 through an inverting input terminal 10A thereof. A reference voltage $V_{RH}$ or $V_{RL}$ ($<V_{RH}$) is input through a non-inverting input terminal 10B thereof. An oscillating signal (VCO output) Sout output from the voltage-controlled oscillator is developed at an output terminal thereof. A switch 11 has the on and off states thereof controlled based on the oscillating signal Sout. When the oscillating signal Sout is high, the switch 11 is turned on. When the oscillating signal Sout is low, the switch 11 is turned off. An inverter 12 inverts the oscillating signal Sout. The on and off states of a switch 13 are controlled based on an output of the inverter 12. When the output of the inverter 12 is high, the switch 13 is turned on. When the output of the inverter 12 is low, the switch 13 is turned off. A switch 14 has the on and off states thereof controlled based on the oscillating signal Sout. The reference voltage $V_{RH}$ is applied to an input terminal 14A of the switch 14, while the reference signal $V_{RL}$ is applied to an input terminal 14B thereof. An output terminal 14C thereof is connected to the non-inverting input terminal 10B of the comparator 10. When the oscillating signal Sout is high, the switch 14 has the input terminal 14A thereof connected to the output terminal 14C thereof. When the oscillating signal Sout is low, the input terminal 14B is connected to the output terminal 14C. The voltage-controlled oscillator shown in FIG. 3 utilizes the integration circuit for detecting the time required until the terminal voltage Vc reaches the predetermined voltage $V_{RH}$ or $V_{RL}$ when the current I is varied as shown in FIG. 2A.

Figure 4:
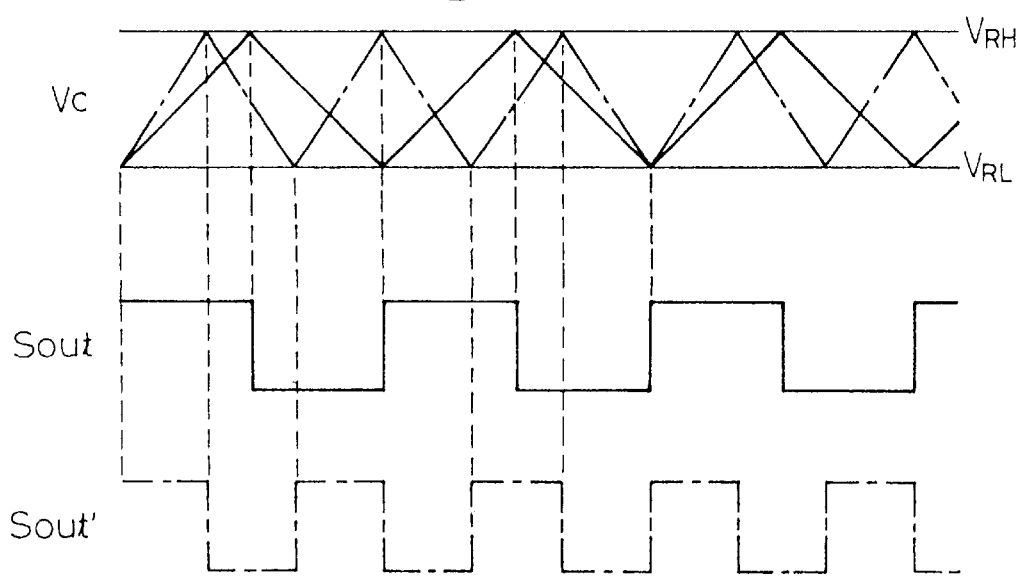
FIG. 4 indicates actions performed in the voltage-controlled oscillator shown in FIG. 3.

FIG. 4 is a waveform diagram indicating actions performed in the conventional voltage-controlled oscillator shown in FIG. 3. As illustrated, in the conventional voltage-controlled oscillator, for example, when the oscillating signal Sout is low, the switch 14 has the input terminal 14B thereof connected to the output terminal 14C thereof. The reference voltage $V_{RL}$ is applied to the non-inverting input terminal 10B of the comparator 10. The switch 11 is turned off. The output of the inverter 12 is driven high. The switch 13 is turned on. Consequently, a direct current proportional to the input voltage Vin flows from the integrating capacitor 9 to the current-controlled current source 8. The terminal voltage Vc of the integrating capacitor 9 falls with the passage of time. When the terminal voltage Vc of the integrating capacitor 9 reaches the reference voltage $V_{RL}$, the oscillating signal Sout is driven high.

Consequently, the switch 14 has the input terminal 14A thereof connected to the output terminal 14C thereof. The reference voltage $V_{RH}$ is applied to the non-inverting input terminal 10B of the comparator 10. The switch 11 is turned on. The output of the inverter 12 is driven low. The switch 13 is turned off. Consequently, a direct current proportional to the input voltage vin flows from the current-controlled current source 7 to the integrating capacitor 9. The terminal voltage Vc of the integrating capacitor 9 rises with the passage of time. When the terminal voltage Vc of the integrating capacitor 9 exceeds the reference voltage $V_{RH}$, the oscillating signal Sout is driven low. The similar actions are repeated thereafter. Eventually, the oscillating signal Sout is output at a frequency dependent on the input voltage Vin. The cycle T of the oscillating signal sout is expressed as $T=(C/I)\times(V_{RH}-V_{RL})$ where C denotes the capacitance of the integrating capacitor 9. Since the relationship of I=Vin/R is established, the cycle T is expressed as $T=(RC/Vin)\times(V_{RH}-V_{RL})$. As shown in FIG. 4, when the input voltage Vin is low, the current I is small and the cycle T is long. Namely, the cycle of the signal Sout is long. When the input voltage Vin is high, the current I is large and the cycle T is short. Namely, the cycle of a signal Sout is short.

Figure 5:
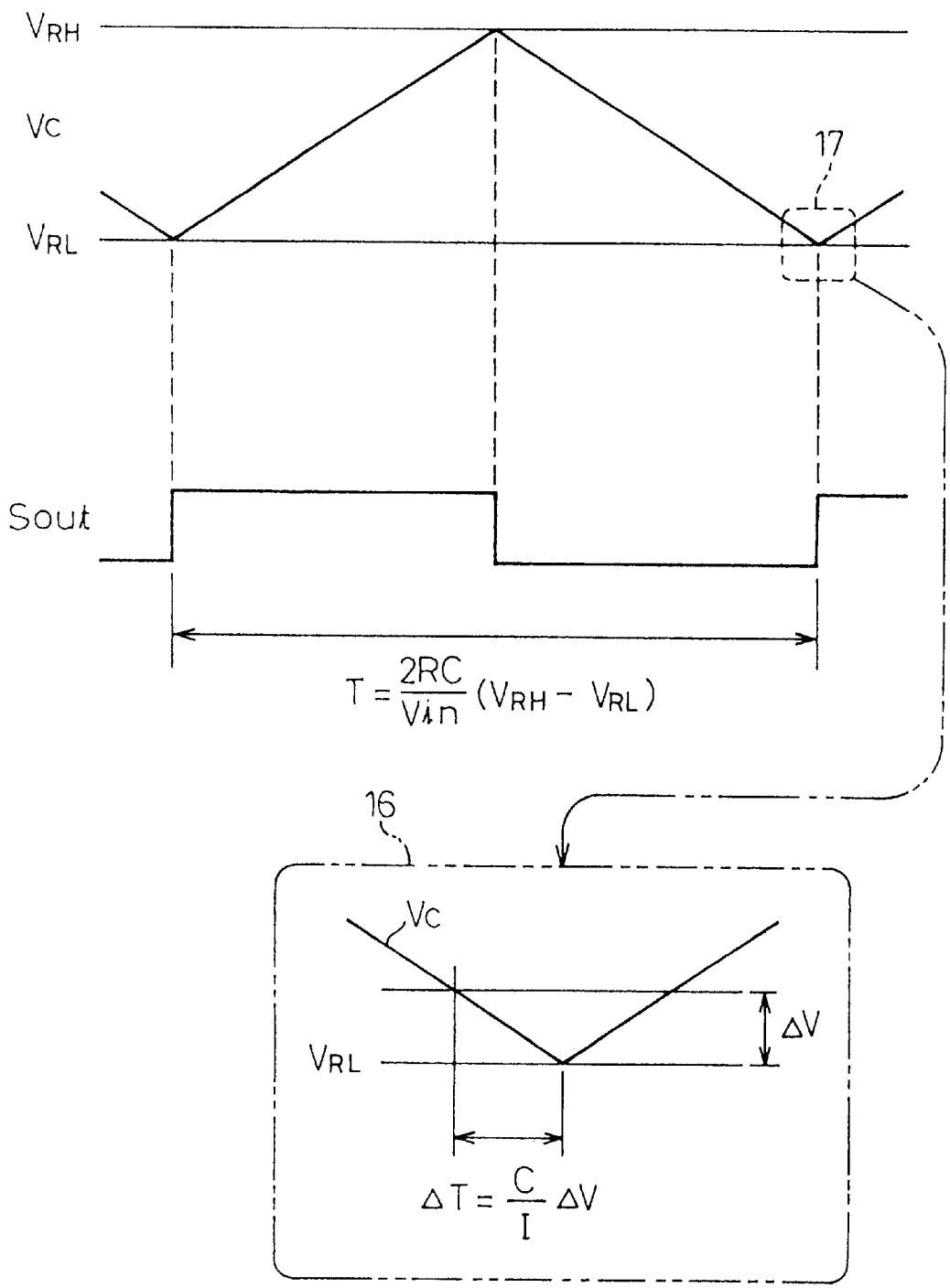
FIG. 5 indicates the action of a switching unit included in the voltage-controlled oscillator shown in FIG. 3, and the influence of noise.

FIG. 5 shows actions performed during one cycle of the signal Sout in the voltage-controlled oscillator shown in FIG. 3. An edge 17 of the voltage Vc at which the signal Sout makes a transition is enlarged and shown in an insert 16 enclosed with alternate long and two short dashes. For example, assume that a noise of a voltage ΔV is superposed on the reference voltage $V_{RL}$. A discharge period during which the integrating capacitor 9 is discharged becomes unstable after a time interval expressed as $\Delta T=(C/I)\times\Delta V$ written in the insert 16 enclosed with alternate long and two short dashes in FIG. 5. This causes jitter in the oscillating signal Sout. Consequently, a high-precision oscillating signal cannot be produced. This is a problem. The same applies to the case in which a noise is superposed on the reference voltage $V_{RH}$. For reducing jitter, the ratio I/C of the current I to the capacitance C must be raised. A change rate at which the terminal voltage Vc of the integrating capacitor 9 makes a transition must be raised to such an extent that the terminal voltage Vc of the integrating capacitor 9 will not exceed the reference voltage. However, the circuit shown in FIG. 3 carries out integration during a time interval coincident with one cycle of the oscillating signal Sout. The terminal voltage Vc is proportional to the integration time. When the ratio I/C is raised, the voltage Vc exceeds the reference voltage. The ratio I/C must therefore be determined in terms of a range within which the integration time varies, that is, a range within which the cycle of the oscillating signal varies, and a difference between the reference voltages, $V_{RH}-V_{RL}$. The ratio I/C cannot therefore be set to a large value.

Figure 6:
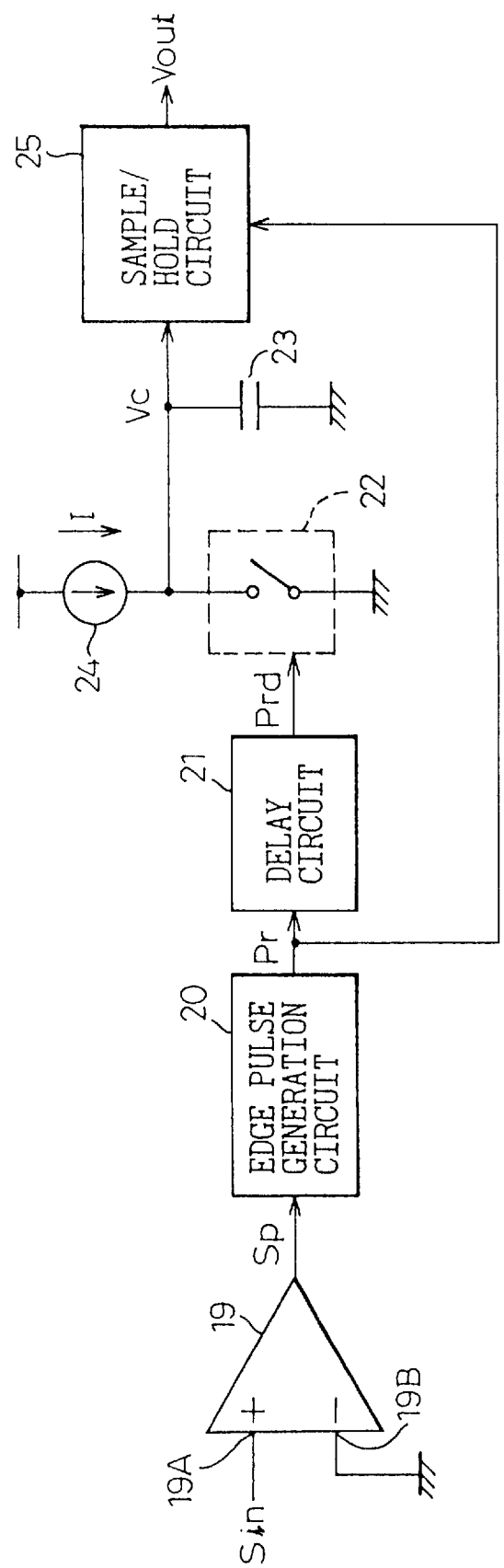
FIG. 6 shows an example of conventional frequency-voltage converters employing an integration circuit.

FIG. 6 is a circuit diagram showing an example of a conventional frequency-voltage converter employing an integration circuit. Referring to FIG. 6, a comparator 19 slices the waveform of an input signal Sin relative to a ground voltage 0 V, and outputs a square-wave signal Sp having the same frequency as the input signal Sin. The input signal Sin is applied to a non-inverting input terminal 19A of the comparator 19, and the ground voltage 0 V is applied to an inverting input terminal thereof 19B. Moreover, an edge pulse generation circuit 20 detects the leading edge of the square-wave signal Sp and generates an edge pulse Pr synchronous with the leading edge of the square-wave signal Sp. A delay circuit 21 delays the edge pulse Pr and outputs a delayed edge pulse Prd. A switch 22 has the on and off states thereof controlled based on the delayed edge pulse Prd output from the delay circuit 21. The switch 22 is turned on when the delayed edge pulse Prd is supplied. When the delayed edge pulse Prd is not supplied, the switch 22 is turned off. Moreover, a constant current source 24 supplies a direct current to an integrating capacitor 23. A sample and hold circuit 25 samples and holds a terminal voltage Vc or a voltage developed at a terminal of the integrating capacitor 23 using the delayed edge pulse Prd as a sampling signal. The frequency-voltage converter shown in FIG. 6 utilizes the integration circuit for detecting the terminal voltage Vc whose values are integrated during a varying time (cycle of an input signal) with the current I held constant.

Figure 7:
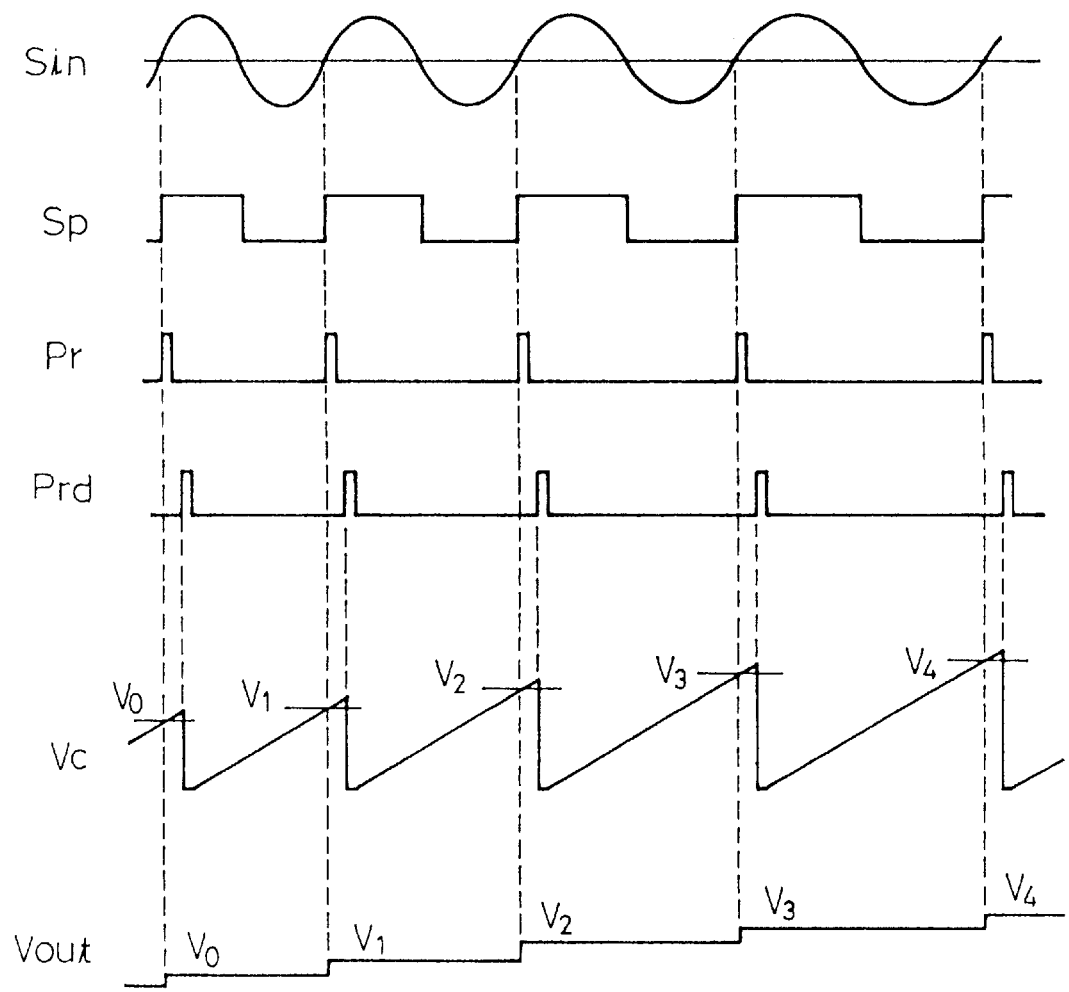
FIG. 7 indicates actions performed in the frequency-voltage converter shown in FIG. 6.

FIG. 7 is a waveform diagram indicating actions performed in the conventional frequency-voltage converter shown in FIG. 6. A voltage Vout is an output voltage of the sample and hold circuit 25 (output voltage of the frequency-voltage converter). For example, when an input signal Sin like the illustrated one is input, the comparator 19 slices the waveform of the input signal Sin relative to the ground voltage 0 V. The comparator 19 outputs a square-wave signal Sp having the same frequency as the input signal Sin. The edge pulse generation circuit 20 detects the leading edge of the square-wave signal Sp, and produces an edge pulse Pr synchronous with the leading edge of the square-wave signal Sp. The sample and hold circuit 25 samples and holds the terminal voltage Vc of the integrating capacitor 23 using the edge pulse Pr as a sampling signal.

On the other hand, the delay circuit 21 delays the edge pulse Pr and outputs a delayed edge pulse Prd. Consequently, the switch 22 is turned on. This causes a direct current output from the constant current source 24 to flow into a ground. The integrating capacitor 23 is discharged, and the terminal voltage Vc of the integrating capacitor 23 is reset to 0 V. When application of the delayed edge pulse Prd to the switch 22 is terminated, the switch 22 is turned off. A direct current is then supplied from the constant current source 24 to the integrating capacitor 23. Integration is then carried out.

The foregoing actions for integration are performed at intervals of one cycle of the input signal Sin. The terminal voltage Vc of the integrating capacitor 23 varies as illustrated. The output voltage Vout of the sample and hold circuit 25 is, as illustrated, proportional to the cycle of the input signal Sin.

In the frequency-voltage converter shown in FIG. 6, the output voltage Vout is proportional to the cycle of the input signal Sin. When a change rate Δf at which the frequency of the input signal Sin changes is low, a change rate ΔV at which the output voltage Vout makes a transition is also low. The output voltage is therefore susceptible to a noise. This poses a problem in that the frequency-voltage converter suffers from a poor signal-to-noise ratio in terms of the output voltage Vout. The ratio I/C of the current I to the capacitance C should therefore be raised. A change rate at which the terminal voltage Vc of the integrating capacitor 23 makes a transition should be raised to such an extent that the terminal voltage Vc will not exceed a voltage that can be sampled and held. Thus, the output voltage Vout will be a high-precision signal to be output at a high signal-to-noise ratio. However, as far as the circuit shown in FIG. 6 is concerned, integration is carried out over a time interval coincident with one cycle of the input signal Sin. If the ratio I/C were raised, the voltage Vc would exceed the voltage that can be sampled and held. The ratio I/C must therefore be determined in terms of a range within which the integration time varies, that is, a range within which the cycle of the input signal varies, and a range of voltages that can be sampled and held. Namely, the ratio I/C cannot be raised.

As mentioned above, as far as a circuit employing an integration circuit is concerned, the ratio I/C of a current to a capacitance should preferably be high enough to minimize the influence of a noise. However, the I/C cannot be raised because the terminal voltage of the integrating capacitor exceeds its limit value.

Figure 8:
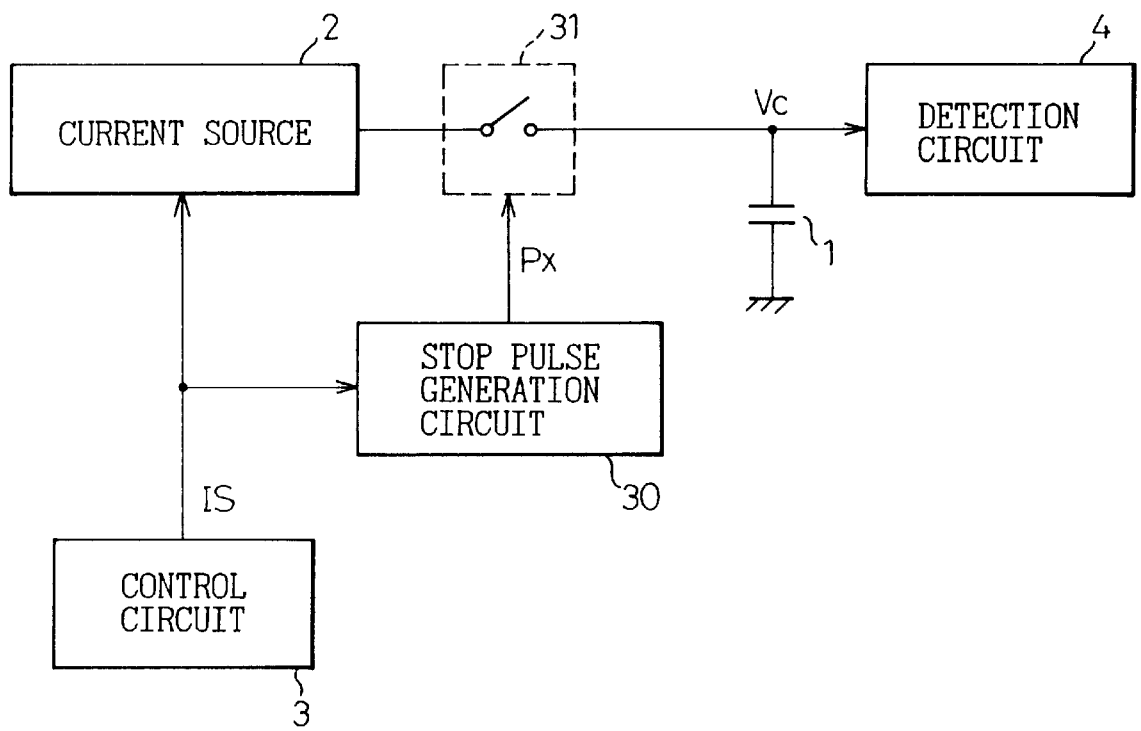
FIG. 8 shows the basic configuration of an integration circuit in accordance with the present invention.

FIG. 8 shows the basic configuration of an integration circuit in accordance with the present invention.

As illustrated, the integration circuit in accordance with the present invention comprises, in addition to the components of the conventional integration circuit shown in FIG. 1, a switch 31 and a stop pulse generation circuit 30. The switch 31 is installed on a path along which a current is supplied from the current source 2 to the integrating capacitor 1. The stop pulse generation circuit 30 generates the stop pulse Px using the integration signal IS sent from the control circuit 3, and supplies it to the switch 31. The stop pulse generation circuit 30 generates the stop pulse Px, which is active during a predetermined period, using the integration signal IS. Accordingly, the switch 31 is opened during the predetermined period.

Figure 9A:
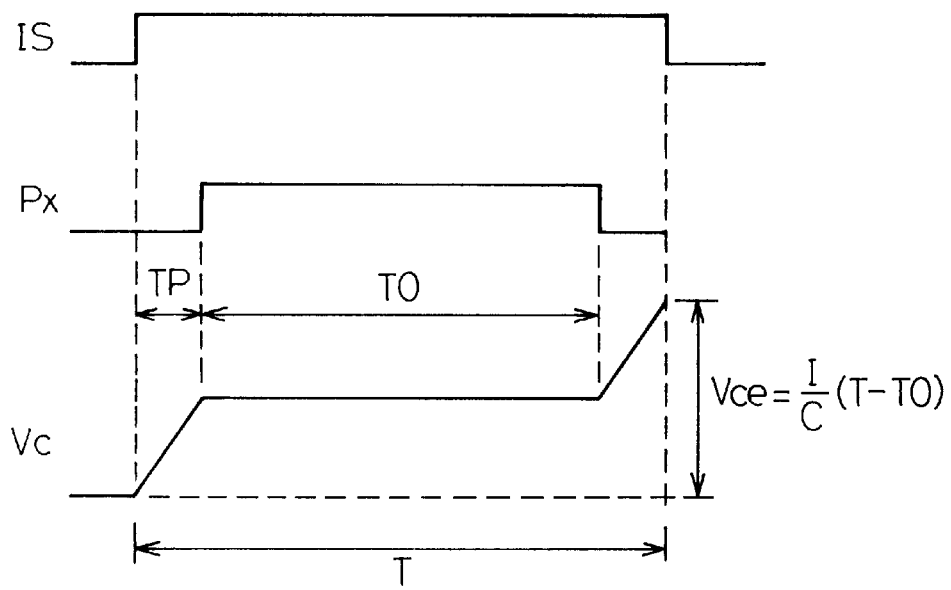
FIG. 9A and FIG. 9B show the action of the integration circuit in accordance with the present invention.
Figure 9B:
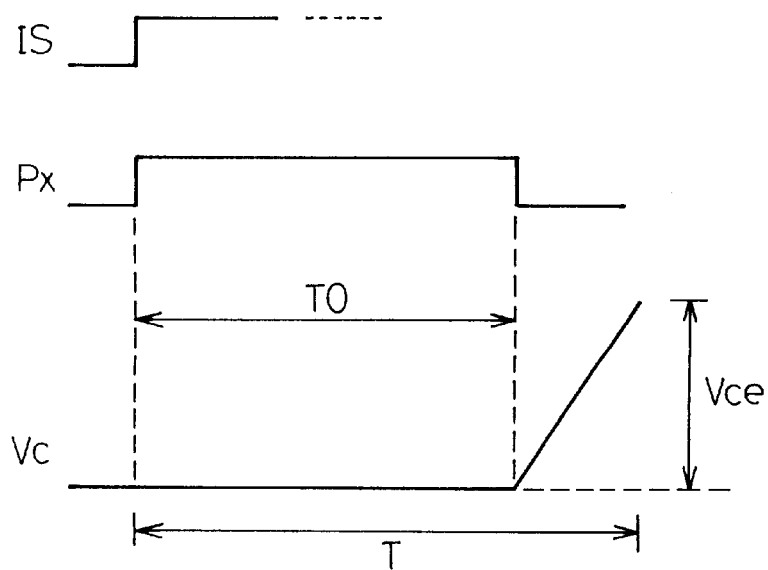

FIG. 9A and FIG. 9B indicate actions performed in the integration circuit shown in FIG. 8. As shown in FIG. 9A, the stop pulse Px rises in a time TP after the integration signal IS rises. The stop pulse Px is active high during a predetermined period T0. Thereafter, the stop pulse Px is inactivated (driven low). Even if an integration period T varies, the sum of the times TP and T0 shall be smaller than the period T. Assuming that the lower limit of the integration period T is TS, the relationship of TP+T0<TS is established. The current source 2 supplies a current during the integration period T. However, while the stop pulse Px is high, the switch 31 is opened. A current is therefore supplied to the integrating capacitor 1 during only a time interval T−T0. The terminal voltage Vc of the integrating capacitor 1 rises proportionally to the current I during the time interval T−T0. The terminal voltage attained at the end of the integration period T, Vce, is expressed as (I/C)×(T−T0).

As mentioned above, in the integration circuit of the present invention, a period during which integration is carried out is expressed as T−T0. As long as the terminal voltage Vc of the integrating capacitor 1 does not exceed a range of detectable voltages, the I/C can be raised. Moreover, the change rate at which the terminal voltage Vc makes a transition can be raised.

In the example shown in FIG. 9A, the stop pulse Px rises in the time TP after the start of the integration period. Alternatively, the stop pulse Px may, as shown in FIG. 9B, rise simultaneously with the start of the integration period. In this case, the times T0 and TS must have the relationship of T0<TS.

Next, a description will be made of the first embodiment in which the integration circuit shown in FIG. 8 is adapted to a voltage-controlled oscillator.

Figure 10:
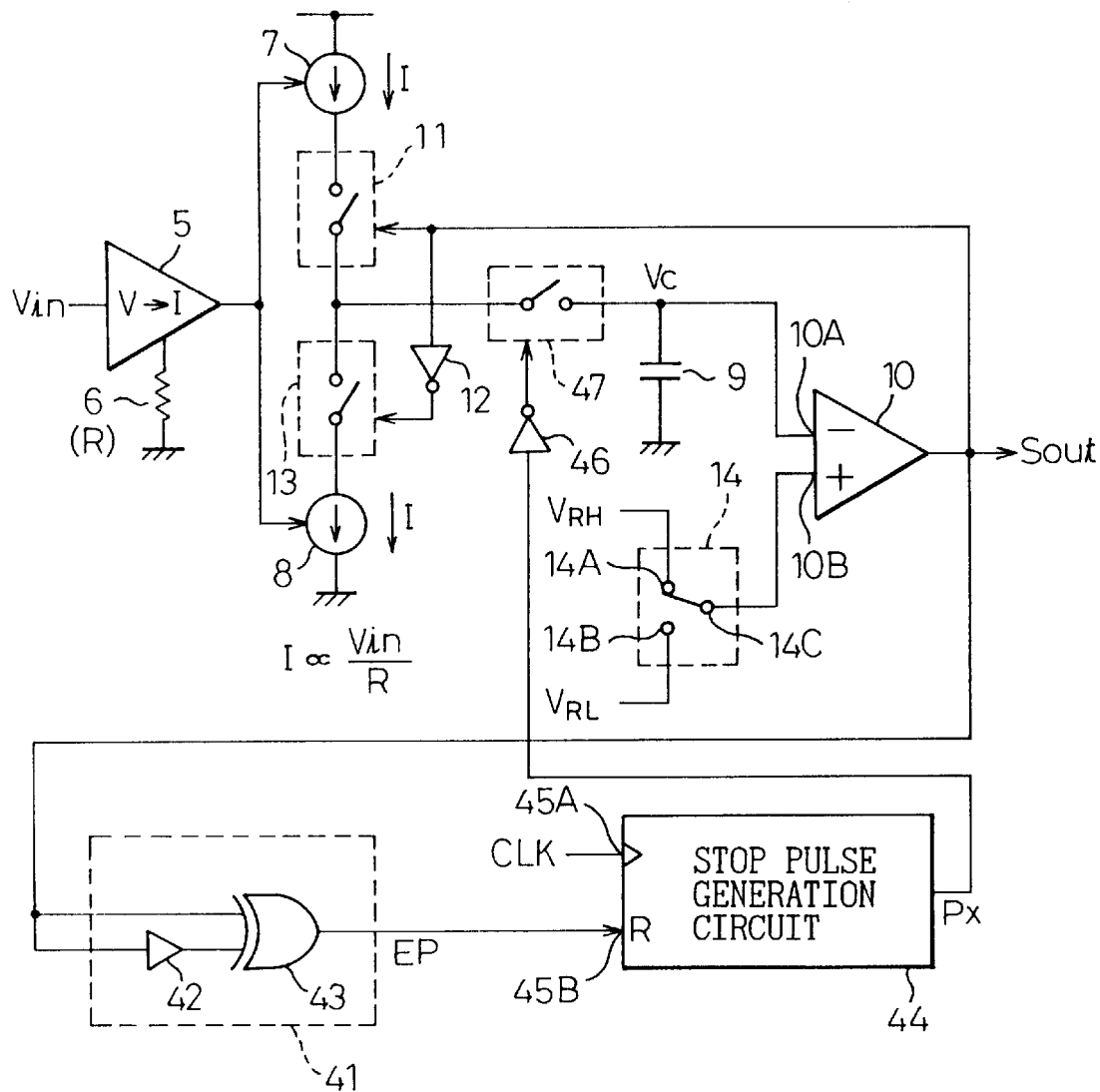
FIG. 10 is a circuit diagram showing the configuration of a voltage-controlled oscillator of the first embodiment employing the integration circuit in accordance with the present invention.

FIG. 10 is a circuit diagram showing the configuration of a voltage-controlled oscillator in accordance with the first embodiment of the present invention. The voltage-controlled oscillator of the first embodiment has the same components as the conventional voltage-controlled oscillator shown in FIG. 3. A difference from the conventional voltage-controlled oscillator lies in a point that a switch 47, an edge pulse generation circuit 41, and a stop pulse generation circuit 44 are included. The switch 47 is installed on a path along which a current flows into the integrating capacitor 9. The edge pulse generation circuit 41 and stop pulse generation circuit 44 are used to generate a stop pulse Px with which the switch 47 is controlled. When a high-level signal is supplied, the switch 47 is closed. An inverter inverts the stop pulse Px and supplies a resultant pulse to the switch 47. The edge pulse generation circuit 41 includes an inverter 42 for delaying and inverting the oscillating signal Sout output from the comparator 10, and an exclusive OR gate 43 that inputs the oscillating signal Sout and an output of the inverter 42. The edge pulse generation circuit 41 generates an edge pulse EP whose duration is short enough to synchronize with the transition edge of the oscillating signal Sout.

Figure 11:
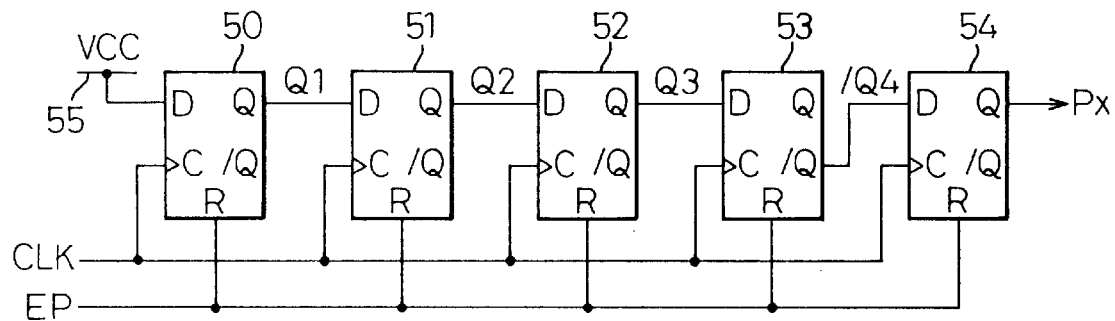
FIG. 11 is a circuit diagram showing the configuration of a stop pulse generation circuit employed in the first embodiment.

FIG. 11 is a circuit diagram showing the configuration of the stop pulse generation circuit 44. D flip-flops 50 to 53 are connected in series with one another so that a positive-phase output terminal Q on a preceding stage will be connected to a data input terminal D on a succeeding stage. A D flip-flop 54 has a data input terminal Q thereof connected to an opposite-phase output terminal /Q of the last D flip-flop 53. A clock CLK is input to clock input terminals C of the D flip-flops 50 to 54. An edge pulse EP output from the edge pulse generation circuit 41 is applied to reset terminals R thereof. Moreover, the data input terminal D of the first D flip-flop 50 is connected on a VCC power line 55. A high-level logic-level signal is applied to the data input terminal D.

Figure 12:
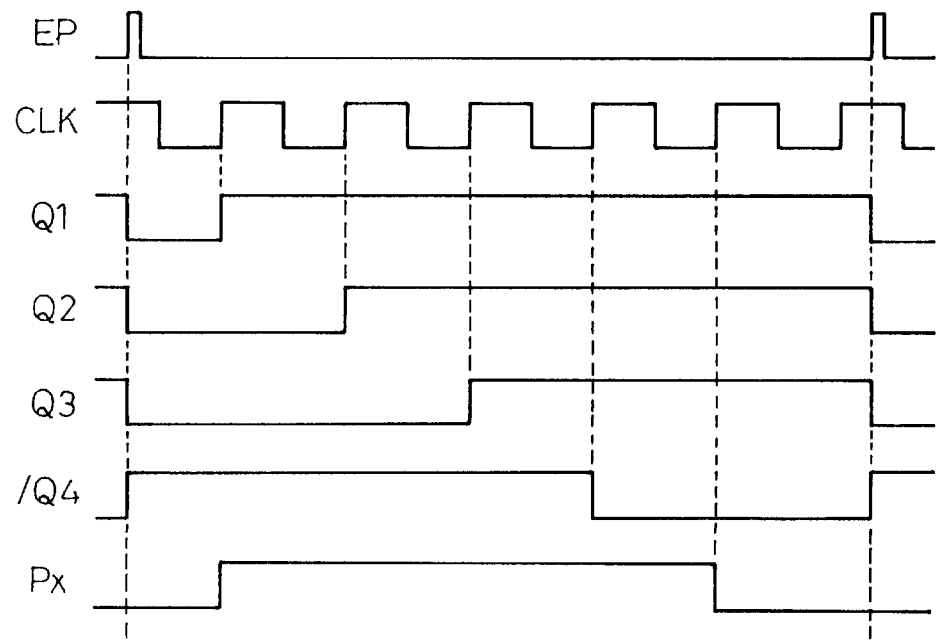
FIG. 12 is a circuit diagram indicating actions performed in the stop pulse generation circuit.

FIG. 12 indicates actions performed in the stop pulse generation circuit 44 shown in FIG. 11. The D flip-flops 50 to 54 are reset in response to the edge pulse EP. Positive-phase outputs Q1, Q2, and Q3 of the D flip-flops 50 to 52 are driven low, and a negative-phase output /Q4 of the D flip-flop 53 is driven high. The stop pulse Px that is a positive-phase output of the D flip-flop 54 is driven low. Thereafter, when the clock CLK rises, the positive-phase output Q1 of the D flip-flop 50 is driven high and the stop pulse Px is driven high. Thereafter, every time the clock rises, the outputs Q2, Q3, and /Q4 make a transition successively. When the time coincident with four cycles of the clock elapses, Px goes low. The clock is produced by utilizing a crystal oscillator or the like. The cycle of the clock is exactly constant. The period during which Px remains high is exactly constant.

Figure 13:
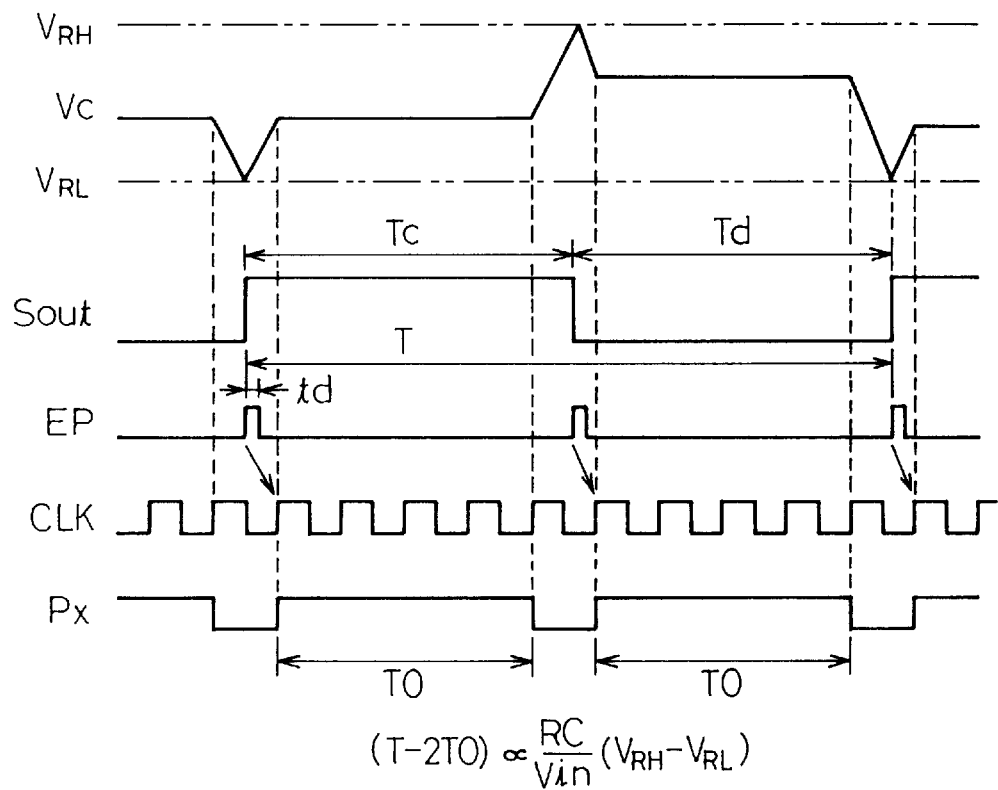
FIG. 13 indicates actions performed in the voltage-controlled oscillator in accordance with the first embodiment.

FIG. 13 is a waveform diagram indicating actions performed in the voltage-controlled oscillator of the first embodiment. For example, assume that the oscillating signal Sout and stop pulse Px are low. The input terminal 42B of the switch 14 is connected to the output terminal 42C thereof. The reference voltage $V_{RL}$ is applied to the non-inverting input terminal 38B of the comparator 38. The switch 11 is opened, and the switch 13 is closed. A current proportional to the input voltage Vin flows from the integrating capacitor 9 to the current-controlled current source 8. The terminal voltage Vc of the integrating capacitor 9 drops with the passage of time.

When the terminal voltage Vc drops to the reference voltage $V_{RL}$, the oscillating signal Sout is driven high, and the edge pulse EP is generated. Accordingly, the input terminal 42A of the switch 14 is connected to the output terminal 42C thereof. The reference voltage $V_{RH}$ is applied to the non-inverting input terminal 38B of the comparator 38. The switch 11 is closed, and the switch 13 is opened. Moreover, the stop pulse Px remains low during the time from the instant the edge pulse EP is input to the stop pulse generation circuit 44 to the instant the clock CLK rises The switch 47 is closed. A current proportional to the input voltage Vin flows from the current-controlled current source 7 to the integrating capacitor 9. The terminal voltage Vc of the integrating capacitor 9 rises with the passage of time.

When the clock CLK rise, the stop pulse Px output from the stop pulse generation circuit 44 is driven high. The switch 47 is opened. Charge of the integrating capacitor 9 by the current-controlled current source is stopped. The terminal voltage Vc remains intact.

Thereafter, when the time coincident with four cycles of the clock elapses, the stop pulse Px is driven high. The switch 47 is closed again. Accordingly, charge of the integrating capacitor 9 by the current-controlled current source 7 is restarted. The terminal voltage Vc rises with the passage of time. Herein, when the terminal voltage Vc rises up to the reference voltage $V_{RH}$, the oscillating signal Sout is driven low and the edge pulse EP is generated. Accordingly, the input terminal 42B of the switch 14 is connected to the output terminal 42C thereof. The reference voltage $V_{RL}$ is applied to the non-inverting input terminal 38B of the comparator 38. The switch 11 is opened, and the switch 13 is closed. Likewise, the stop pulse Px remains low during the time from the instant the edge pulse EP is input to the stop pulse generation circuit 44 to the instant the clock CLK rises. The switch 47 is closed. Consequently, a current proportional to the input voltage Vin flows from the integrating capacitor 9 to the current-controlled current source 8. The terminal voltage Vc of the integrating capacitor 9 drops with the passage of time.

Likewise, when the close CLK rises, the stop pulse Px output from the stop pulse generation circuit 44 is driven high. The switch 47 is opened. Consequently, discharge of the integrating capacitor 9 to the current-controlled current source 8 is stopped, and the terminal voltage Vc remains intact. When the time coincident with four cycles of the clock elapses, the stop pulse Px is driven high. The switch 47 is closed again. The above series of actions is repeated thereafter.

As mentioned above, the time, during which the integrating capacitor is actually charged, within a charge time is expressed as Tc−T0. The time, during which the integrating capacitor 9 is actually discharged, within a discharge time is expressed as Td−T0. Herein, the charge time during which the integrating capacitor 9 is charged is Tc, the discharge time during which the integrating capacitor 9 is discharged is Td, and the duration of the pulse Px is T0. A period, during which integration is actually carried out, within one cycle of the oscillating signal is expressed as T−2T0. Consequently, in the voltage-controlled oscillator of the first embodiment, the relationship of $(T-2T0)=2(RC/Vin)\times(V_{RH}-V_{RL})$ is established.

Figure 14:
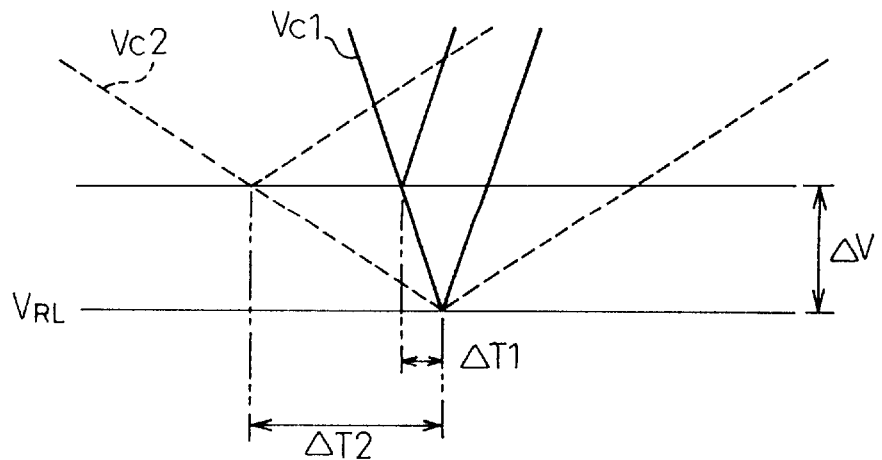
FIG. 14 is an explanatory diagram concerning a difference in occurrence of jitter between the voltage-controlled oscillator of the first embodiment and that of the related art.

FIG. 14 is an explanatory diagram concerning the influence exercised on the discharge time, during which the integrating capacitor 9 is discharged, when a noise of a voltage ΔV is superposed on the reference voltage $V_{RL}$. A solid line Vc1 indicates the influence exercised in this embodiment, while a dashed line Vc3 indicates the influence exercised in the related art shown in FIG. 3. Moreover, ΔT1 represents the instability of the discharge time during which the integrating capacitor 9 employed in this embodiment is discharged. ΔT2 denotes the instability of the discharge time during which the integrating capacitor 9 employed in the related art is discharged. As illustrated, the instability ΔT is expressed as (C/1)×ΔV. The lower the ratio C/I is, the higher the change rate at which the terminal voltage Vc makes a transition is. The instability ΔT diminishes in proportion. The ratio C/I in this embodiment is lower than that in the related art. The change rate at which the terminal voltage Vc makes a transition in this embodiment is higher. If the noise ΔV is superposed on the reference voltage, the instability ΔT1 in this embodiment is smaller than the instability ΔT2 in the related art. The instability ΔT relates to the cycle of the oscillating signal Sout and causes jitter. For this reason, the jitter occurring in this embodiment is smaller.

The duration of the stop pulse is determined according to the conditions for use of the voltage-controlled oscillator. Any other condition, for example, the ratio I/C is determined according to the pulse duration. For example, the voltage-controlled oscillator of the first embodiment is adapted to an oscillator for generating a carrier of 455 kHz with a deviation of 3 kHz. This adaptation will be discussed. Since the frequency of the carrier is 455 kHz, the cycle T thereof is approximately 2.2 μs. Since the frequency contains the deviation of 3 kHz, the variation in the cycle T is approximately 15 ns. From this viewpoint, the period during which charge or discharge is actually carried out should be set to about 50 ns at most. The time coincident with 97.5% of the cycle T can be regarded as a stop period. In this case, unless a condition of a voltage is changed, the ratio I/C can be set to about forty times as large a value. Jitter can be reduced accordingly.

Next, a description will be made of the second embodiment in which the integration circuit shown in FIG. 8 is adapted to a frequency-voltage converter.

Figure 15:
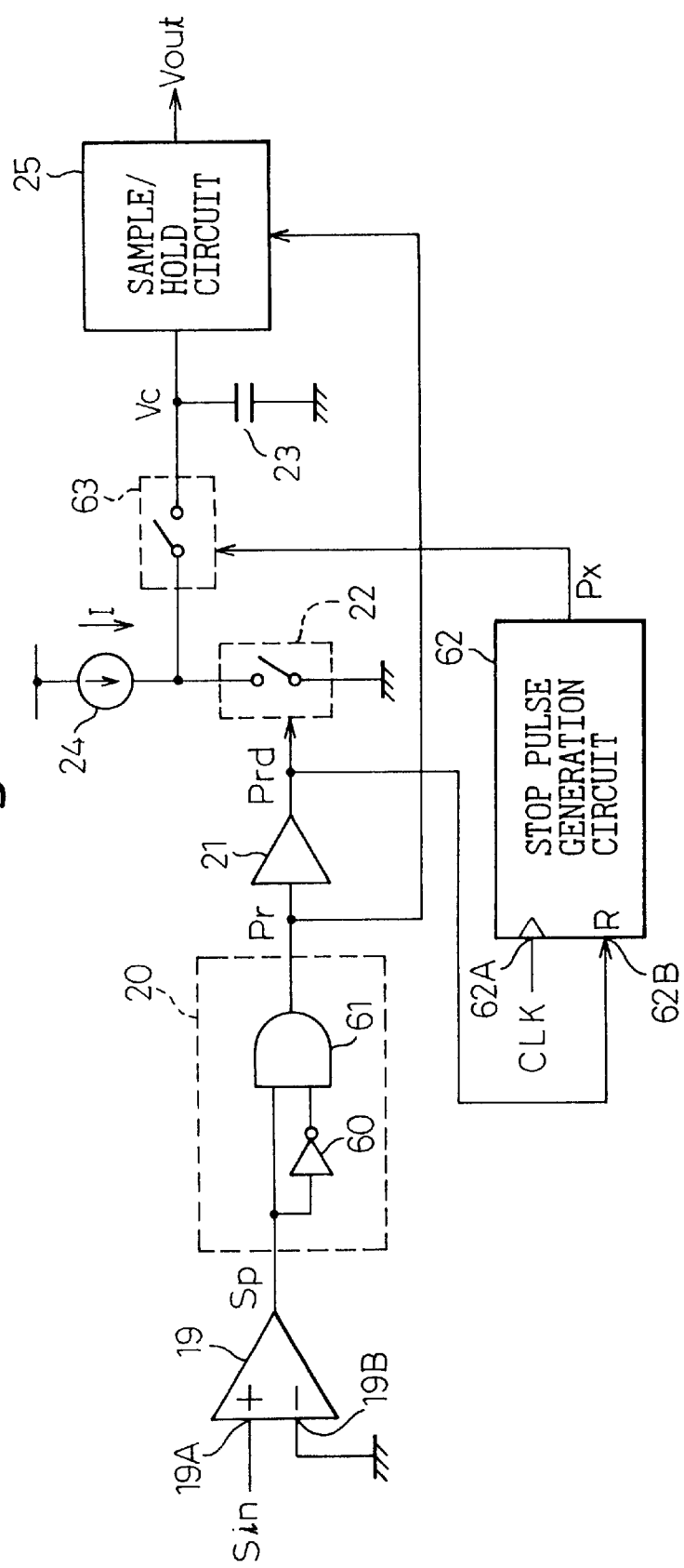
FIG. 15 is a circuit diagram showing the configuration of a frequency-voltage converter of the second embodiment employing the integration circuit in accordance with the present invention.

FIG. 15 is a circuit diagram showing the configuration of the frequency-voltage converter in accordance with the second embodiment of the present invention. The frequency-voltage converter of the second embodiment has the same components as the conventional frequency-voltage converter shown in FIG. 6. A difference from the conventional frequency-voltage converter lies in a point that a switch 63 and a stop pulse generation circuit 62 are included. The switch 63 is installed on a path along which a current flows into the integrating capacitor 23. The stop pulse generation circuit 62 generates a stop pulse Px with which the switch 63 is controlled. The edge pulse generation circuit 20 is, as illustrated, composed of an inverter 60 and an AND gate 61. The edge pulse generation circuit 20 generates a short pulse Pr at the leading edge of the signal Sp. With supply of a high-level signal, the switch 63 is opened.

Figure 16:
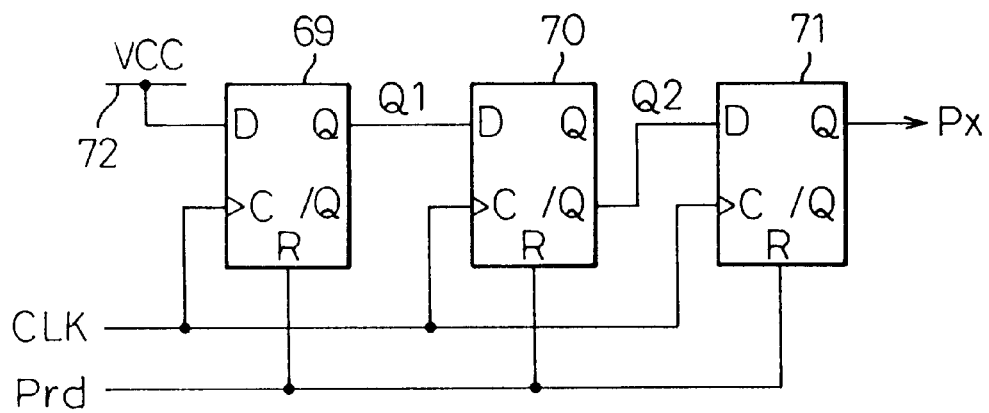
FIG. 16 is a circuit diagram showing the configuration of a stop pulse generation circuit employed in the second embodiment.
Figure 17:
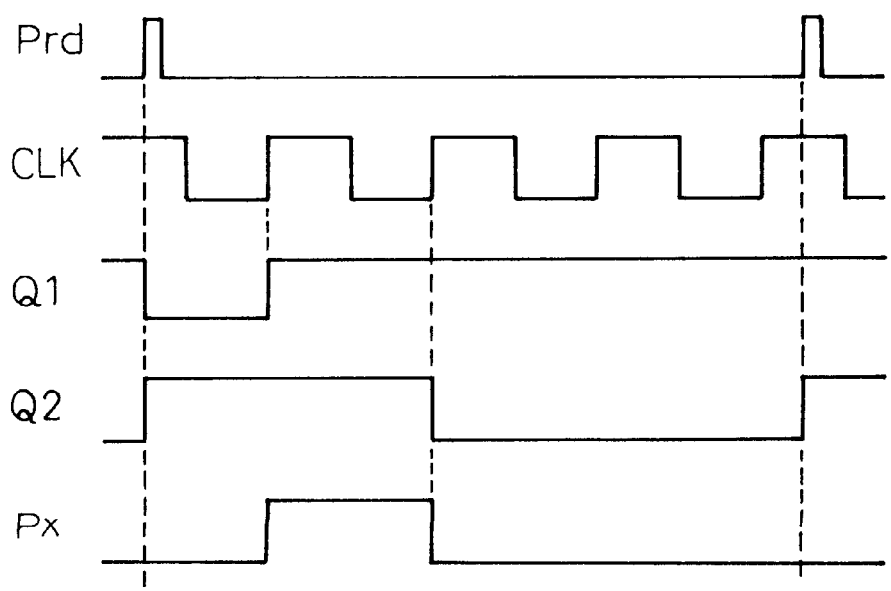
FIG. 17 indicates actions performed in the stop pulse generation circuit.

FIG. 16 is a circuit diagram showing the configuration of the stop pulse generation circuit 62. FIG. 17 shows actions performed in the stop pulse generation circuit 62. As illustrated, the stop pulse generation circuit 62 is analogous to the circuit shown in FIG. 11 except that the number of stages of flip-flops is different. The description of the configuration will therefore be omitted.

Figure 18:
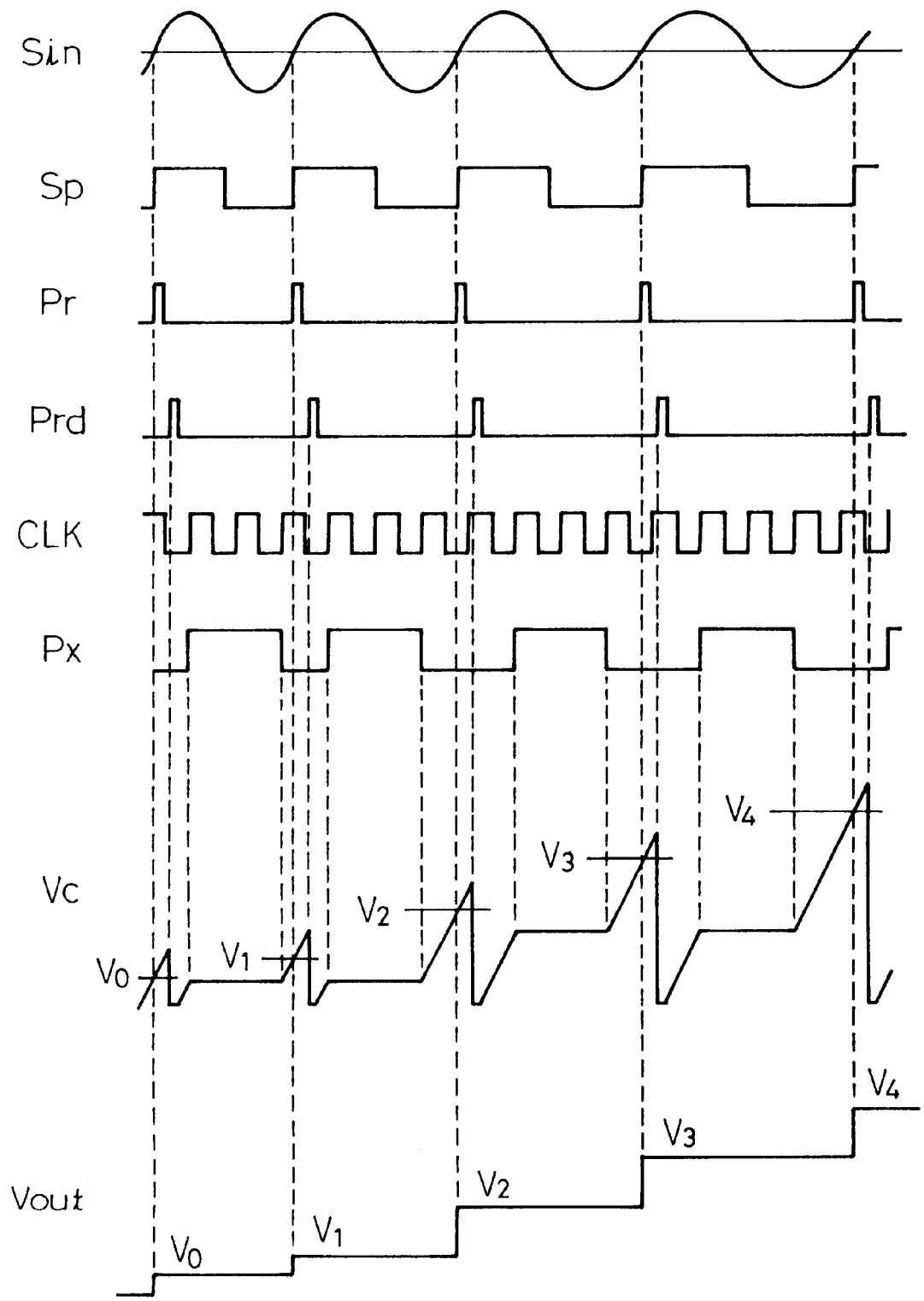
FIG. 18 indicates actions performed in the frequency-voltage converter in accordance with the second embodiment.

FIG. 18 is a waveform diagram indicating actions performed in the frequency-voltage converter of the second embodiment shown in FIG. 15. When an input signal Sin like the illustrated one is input, the comparator 19 slices the waveform of the input signal Sin relative to a ground voltage 0 V. The comparator 19 then outputs a square-wave signal Sp having the same frequency as the input signal Sin. The edge pulse generation circuit 20 detects the leading edge of the square-wave signal Sp, and generates an edge pulse Pr synchronous with the leading edge of the square-wave signal Sp. The sample and hold circuit 25 samples and holds the terminal voltage Vc of the integrating capacitor 23 using the edge pulse Pr as a sampling signal.

On the other hand, the delay circuit 21 delays the edge pulse Pr and outputs a delayed edge pulse Prd. Consequently, the switch 22 is turned on. This causes a direct current output from the constant current source 24 to flow into the ground. The integrating capacitor 23 is discharged, and the terminal voltage Vc of the integrating capacitor 23 is reset to 0 V. When supply of the delayed edge pulse Prd to the switch 22 is terminated, the switch 22 is turned off. At this time, the stop pulse Px is low. The switch 63 is closed. A direct current is therefore supplied from the constant current source 24 to the integrating capacitor 23. Actions for integration are carried out.

After the delayed edge pulse Prd is supplied from the delay circuit 21 to the stop pulse generation circuit 62, when the clock CLK rises first, the stop pulse Px is driven high. The switch 63 is opened. Consequently, supply of a current from the constant current source 24 to the integrating capacitor 23 is stopped, and the terminal voltage Vc of the integrating capacitor 23 is retained at the voltage attained at that time.

Thereafter, when the clock CLK rises twice, the stop pulse signal Px is driven low, and the switch 63 is closed again. Supply of a current from the constant current source 24 to the integrating capacitor 23 is restarted. When the edge pulse Pr is generated by the edge pulse generation circuit 20, the sample and hold circuit 25 samples and holds the terminal voltage Vc. The foregoing actions are repeated thereafter.

An output voltage Vout of the sample and hold circuit 25 varies depending on the cycle of the input signal Sin. More particularly, the output voltage Vout is expressed as (I/C)×(T−T0−Te)=(I/C)×T+constant. Herein, the cycle of the input signal Sin is T, the duration of the edge pulse is Te, the duration of the stop pulse Px is T0, the current supplied from the current source 24 is I, and the capacitance of the integrating capacitor is C.

In the frequency-voltage converter of this embodiment, the change rate at which the output voltage Vout makes a transition can be increased without the necessity of raising the output voltage Vout. Consequently, high-precision conversion can be achieved at a high signal-to-noise ratio.

The duration of the stop pulse employed in the first and second embodiments should be set to a predetermined value but may be variable. When the pulse duration is variable, as far as the voltage-controlled oscillator of the first embodiment is concerned, a range of frequencies at which oscillation occurs will be expanded. As far as the frequency-voltage converter of the second embodiment is concerned, a range of frequencies at which an input signal is received will be expanded.

Figure 19:
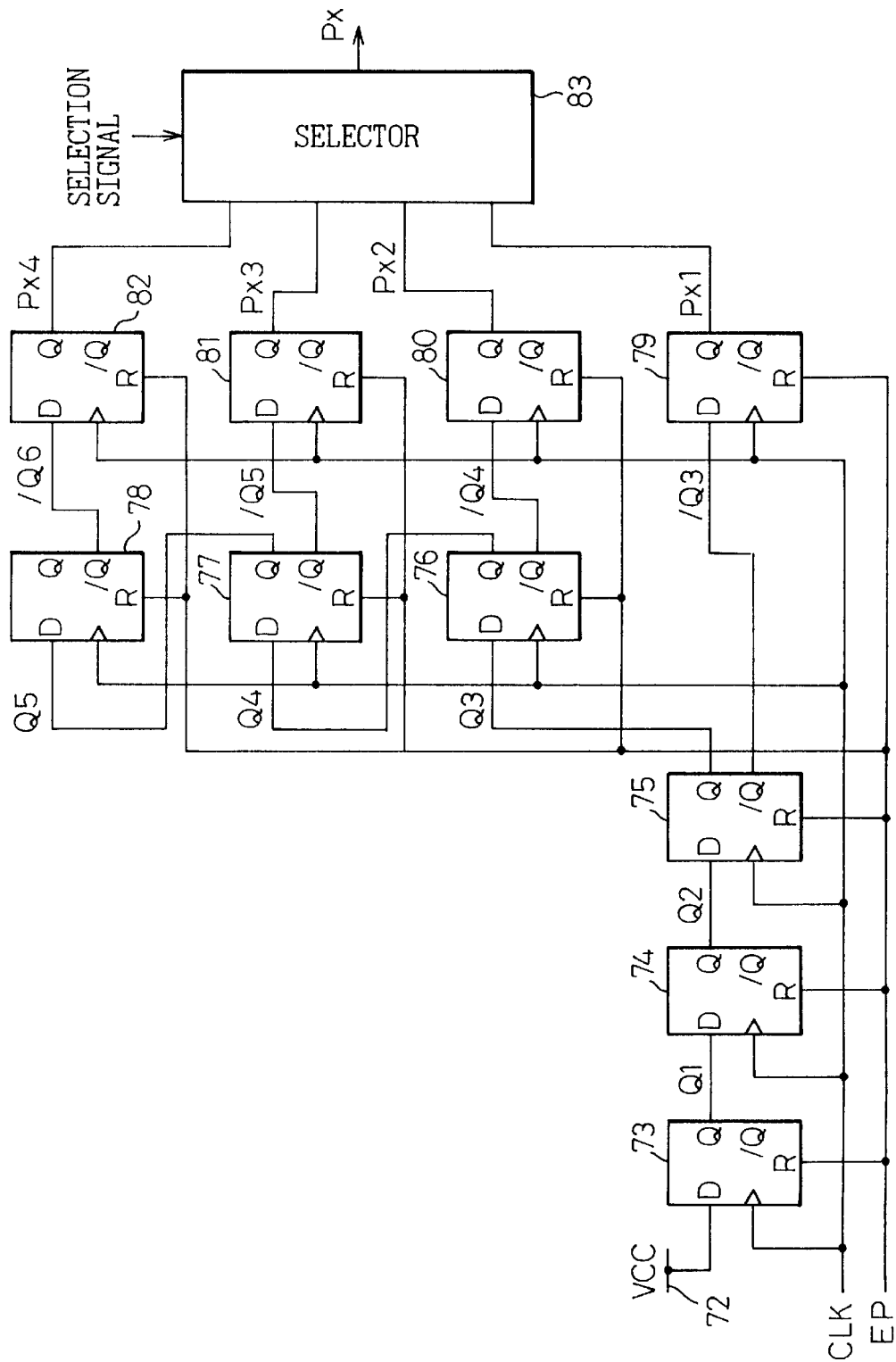
FIG. 19 is a circuit diagram showing the configuration of a variable pulse duration stop pulse generation circuit for generating a pulse whose duration is variable.
Figure 20:
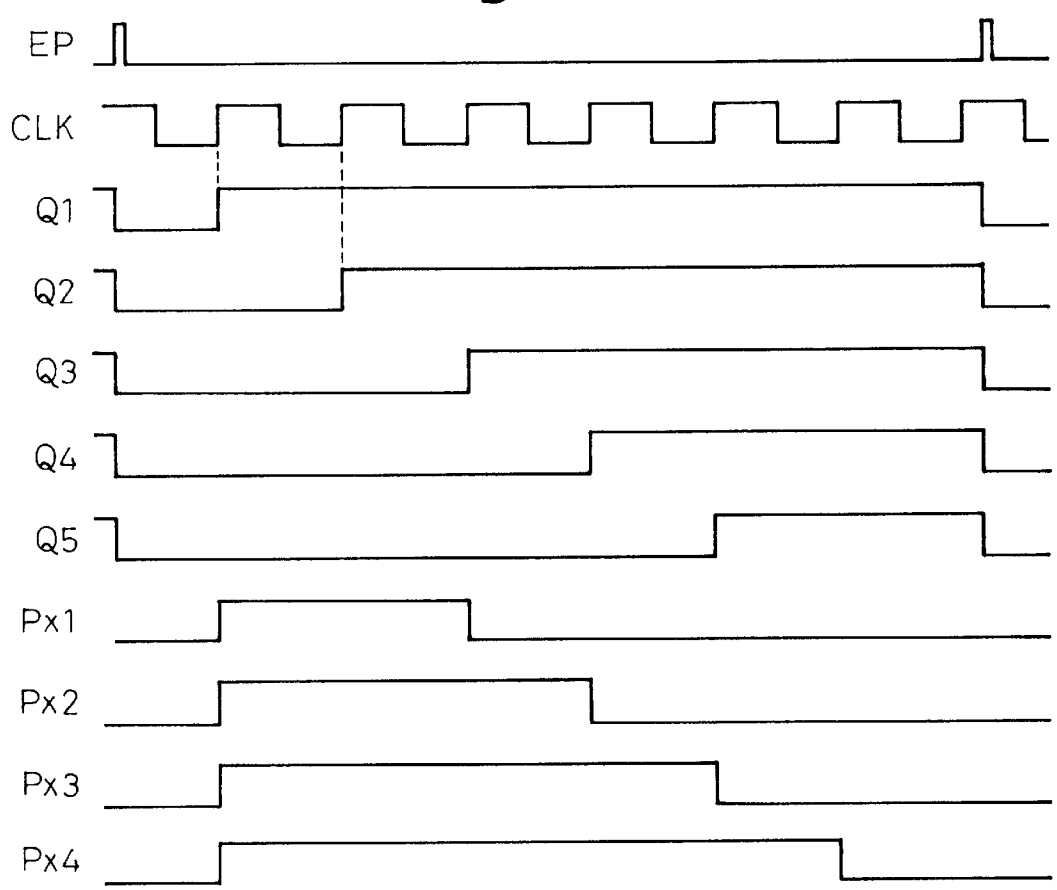
FIG. 20 indicates actions performed in the variable pulse duration stop pulse generation circuit.

FIG. 19 shows an example of configurations of a stop-pulse generation circuit for generating a stop pulse Px whose duration is variable. FIG. 20 shows actions performed in the variable pulse duration stop pulse generation circuit shown in FIG. 19. As illustrated, a plurality of D flip-flops 73 to 78 is connected in series with one another so that a positive-phase output terminal Q on a preceding stage will be connected to a data input terminal D on a succeeding stage. D flip-flops 79 to 82 have their data input terminals D connected to opposite-phase output terminals /Q of the D flip-flops 75, 76, 77, and 78. The D flip-flops 79 to 82 generate stop pulses Px1 to Px4. After the edge pulse EP is input, the stop pulses Px1 to Px4 are driven high at the first leading edge of the clock CLK. Thereafter, the stop pulses Px1 to Px4 are driven low at the third to sixth leading edges of the clock CLK. A selector 83 selects any of the stop pulses Px1 to Px4 according to a selection signal, and outputs the selected one as a pulse Px. The duration of the pulse Px can thus be made variable.

As described above, according to the present invention, a period, during which integration is actually carried out, within an integration period is expressed as [integration period−stop period]. A ratio I/C can be raised and a change rate at which a terminal voltage makes a transition can be raised. Consequently, for example, jitter occurring in a voltage-controlled oscillator can be minimized, and a signal-to-noise ratio offered by a frequency-voltage converter can be improved.

What is claimed is:

1. An integration method having a charge step of charging an integrating capacitor within an integration period, and a voltage detection step of detecting a voltage developed at said integration capacitor, wherein said charge step comprises:
    a first current supply step of supplying a current proportional to a voltage level of an input signal to said integrating capacitor;
    a second current supply step for causing said current proportional to the voltage level of said input signal to flow from said integrating capacitor; and
    a control step comprising:
        a stop step of stopping charge of said integrating capacitor during a predetermined period;
        a first switching step for controlling said stop step;
        a second switching step for switching in association with phases opposite to phases with which said first switching step is opened or closed; and
        a stop signal generation step for generating a stop signal, which becomes active during said predetermined period in response to an oscillating signal.

2. An integration method according to claim 1, wherein a current with which said integrating capacitor is charged at said current supply step is a designated current, and the timing according to which said voltage developed at said integrating capacitor reaches a predetermined voltage when said integrating capacitor is charged with said designated current is detected at said voltage detection step.

3. An integration method according to claim 1, wherein a current with which said integrating capacitor is charged at said current supply step is a predetermined current, said integration period is a designated period, and said voltage developed at said integrating capacitor when said integrating capacitor is charged with said predetermined current during a period remaining after said period set at said stop step is subtracted from said integration period is detected at said voltage detection step.

4. An integration method according to claim 1, wherein said current supply step falls into a first current supply step preceding said stop step and a second current supply step succeeding said stop step.

5. An integration method according to claim 1, wherein said predetermined period during which charge of said integrating capacitor is stopped is variable.

6. An integration circuit, comprising:
    an integrating capacitor;
    a current source for supplying a current to said integrating capacitor;
    a switch installed on a path along which a current is supplied from said current source to said integrating capacitor;
    a detection circuit for detecting a voltage developed at said integrating capacitor;
    a control circuit for controlling said switch so that a current will be supplied from said current source to said integrating capacitor during an integration period; and
    a charge/discharge circuit comprising:
        a first current source for supplying a current proportional to a voltage level of an input signal to said integrating capacitor; and
        a second current source for causing said current proportional to the voltage level of said input signal to flow from said integrating capacitor, wherein
    said integration period falls into a current supply period and a stop period; and
    said control circuit controls said switch so that a current will be supplied from said current source to said integrating capacitor during said current supply period and no current will be supplied from said current source to said integrating capacitor during said stop period, and wherein
    said control circuit comprises:
        a stop switch installed on a path along which a current flows for charging or discharging said integrating capacitor;
        a first switch interposed between said first current source and stop switch;
        a second switch interposed between said second current source and stop switch and alternately closed and opened in association with phases opposite to phases with which said first switch is closed and opened; and
        a stop signal generation circuit for generating a stop signal, which becomes active during said predetermined period, in response to said oscillating signal, and said stop switch is opened in response to said stop signal.

7. An integration circuit according to claim 6, wherein said current to be supplied from said current source is a designated current, and said detection circuit detects the timing according to which said voltage developed at said integrating capacitor reaches said predetermined voltage when said integrating capacitor is charged with said designated current.

8. An integration circuit according to claim 6, wherein said current to be supplied from said current source is a predetermined current, said integration period is a designated period, and said detection circuit detects said voltage developed at said integrating capacitor when said integrating capacitor is charged with said predetermined current during a period remaining after said period set at said stop step is subtracted from said integration period.

9. An integration circuit according to claim 6, wherein said current supply period falls into a first current supply period preceding said stop period and a second current supply period succeeding said stop period.

10. An integration circuit according to claim 6, wherein said predetermined period during which charge of said integrating capacitor is stopped is variable.

11. A voltage controlled oscillator for outputting an oscillating signal whose frequency varies depending on the voltage level of an input signal, comprising:
   an integrating capacitor;
   a charge/discharge circuit for charging or discharging said integrating capacitor with a current proportional to the voltage level of said input signal;
   a reference level source for selectively outputting a first reference level and second reference level;
   a comparison circuit for comparing a voltage developed at said integrating capacitor with a reference level output from said reference level source, and outputting the results of comparision in the form of said oscillating signal; and
   a control circuit for controlling charge and discharge of said integrating capacitor by said charge/discharge circuit, wherein
   said reference level source alternately outputs said first and second reference levels in response to said oscillating signal, and
   said control circuit controls said charge/discharge circuit so that said charge/discharge circuit will alternately switch charge and discharge of said integrating capacitor in response to said oscillating signal, stop charge during a predetermined period within a charge period, and stop discharge during a predetermined period within a discharge period, wherein
   said charge/discharge circuit comprises:
      a first current source for supplying said current proportional to the voltage level of said input signal to said integrating capacitor; and
      a second current source for causing said current proportional to the voltage level of said input signal to flow from said integrating capacitor, and wherein
   said control circuit comprises:
      a stop switch installed on a path along which a current flows for charging or discharging said integrating capacitor;
      a first switch interposed between said first current source and stop switch; a second switch interposed between said second current source and stop switch and alternately closed and opened in association with phases opposite to phases with which said first switch is closed and opened; and
      a stop signal generation circuit for generating a stop signal, which becomes active during said predetermined period, in response to said oscillating signal, and said stop switch is opened in response to said stop signal.

12. A voltage-controlled oscillator according to claim 11, wherein said stop signal generation circuit comprises an edge pulse generation circuit for generating an edge pulse by detecting the transition edge of said oscillating signal, and a switching signal generation circuit for generating said stop signal from said edge pulse and a clock.

13. A voltage-controlled oscillator according to claim 12, wherein said switching signal generation circuit comprises a first D flip-flop for inputting a first logic level through a data input terminal thereof, a plurality of D flip-flops connected in tandem with said first D flip-flop as the first-stage flip-flop so that each D flip-flop will input a positive-phase output of a preceding-stage D flip-flop through a data input terminal thereof, and a last D flip-flop for inputting an opposite-phase output of the last D flip-flop out of said plurality of D flip-flops through a data input terminal thereof; and said clock is applied to the clock input terminals of said first D flip-flop, said plurality of D flip-flops, and said last D flip-flop, and said edge pulse is applied to the reset terminals thereof.

14. A voltage-controlled oscillator according to claim 11, wherein said predetermined period within said charge period during which charge is stopped and said predetermined period within said discharge period during which discharge is stopped are variable.

15. A frequency-voltage converter for generating a voltage dependent on the frequency of an input oscillating signal, comprising:
   an integrating capacitor;
   a reset circuit for resetting the terminal voltage of said integrating capacitor at intervals of one cycle of said oscillating signal;
   a constant current source for charging said integrating capacitor with a constant current;
   a charge control circuit for controlling charge so that charge will be stopped during a predetermined period within a charge period within which said integrating capacitor is charged; and
   a sample and hold circuit for sampling and holding a voltage developed at said integrating capacitor at the end of said charge period within which said integrating capacitor is charged, wherein
   said reset circuit comprises:
      a square-wave signal generation circuit for generating a square-wave signal by comparing said input signal with a predetermined voltage;
      an edge pulse generation circuit for generating an edge pulse by detecting the leading edge or trailing edge of said square-wave signal;
      a delay circuit for delaying said edge pulse and outputting a delayed edge pulse; and
      a reset switch interposed between said integrating capacitor and a reset voltage source and closed in response to said delayed edge pulse.

16. A frequency-voltage converter according to claim 15, wherein said charge control circuit comprises a stop signal generation circuit for generating a stop signal, which becomes active during said predetermined period during which charge is stopped, from said delayed edge pulse and clock, and a switch interposed between said integrating capacitor and constant current source and opened in response to said stop signal.

17. A frequency-voltage converter according to claim 16, wherein said stop signal generation circuit comprises a first D flip-flop for inputting a first logic level through a data input terminal thereof, a plurality of D flip-flops connected in tandem with said first D flip-flop as a first-stage flip-flop so that each D flip-flop will input a positive-phase output of a preceding-stage D flip-flop through a data input terminal thereof, and a last D flip-flop for inputting an opposite-phase output of the last D flip-flop out of said plurality of D flip-flops through a data input terminal thereof; and said clock is applied to the clock input terminals of said first D flip-flop, said plurality of D flip-flops, and said last D flip-flop, and said edge pulse is applied to the reset terminals thereof.

18. A frequency-voltage converter according to claim 15, wherein said predetermined period within said charge period during which charge is stopped and said predetermined period within said discharge period during which discharge is stopped are variable.

* * * * *